United States Patent
Bellemare et al.

(10) Patent No.: US 9,202,946 B2
(45) Date of Patent: Dec. 1, 2015

(54) METHODS FOR METALLIZING AN ALUMINUM PASTE

(71) Applicants: Richard Bellemare, Marlboro, NJ (US); Denis Morrissey, Huntington, NY (US); Anthony Piano, Lodi, NJ (US)

(72) Inventors: Richard Bellemare, Marlboro, NJ (US); Denis Morrissey, Huntington, NY (US); Anthony Piano, Lodi, NJ (US)

(73) Assignee: OMG Electronic Chemicals, Inc., South Plainfield, NJ (US)

( * ) Notice: Subject to any disclaimer, the term of this patent is extended or adjusted under 35 U.S.C. 154(b) by 0 days.

(21) Appl. No.: 13/763,117

(22) Filed: Feb. 8, 2013

(65) Prior Publication Data

US 2014/0227827 A1    Aug. 14, 2014

(51) Int. Cl.
*H01L 21/00* (2006.01)
*H01L 31/0224* (2006.01)

(52) U.S. Cl.
CPC .............................. *H01L 31/022425* (2013.01)

(58) Field of Classification Search
USPC .................................................. 438/678, 688
See application file for complete search history.

(56) References Cited

U.S. PATENT DOCUMENTS

| | | | |
|---|---|---|---|
| 2,935,425 | A | 5/1960 | Gutzeit et al. |
| 3,810,847 | A | 5/1974 | Kristiansen |
| 2005/0104207 | A1 | 5/2005 | Dean et al. |
| 2005/0173255 | A1 | 8/2005 | Bokisa et al. |
| 2007/0075406 | A1 | 4/2007 | Ho et al. |
| 2009/0058230 | A1 | 3/2009 | Kear et al. |

FOREIGN PATENT DOCUMENTS

WO    WO2012/125587    9/2012

OTHER PUBLICATIONS

PCT, International Search Report and the Written Opinion of the International Searching Authority, in Application No. PCT/US13/25348, dated Apr. 16, 2013.
Hutt, Da et al., Electroless Nickel Bumping of Aluminum Bondpads—Part I: Surface Pretreatment and Activation, IEEE Transactions on Components and Packaging Technologies, Mar. 2002, vol. 25, No. 1; p. 88, right column, first full paragraph.
Material Safety Data Sheet. Datasheet [online] Sigma-Aldrich, Aug. 9, 2012; [retrieved on Mar. 27, 2013. Retrieved from the Internet: <URL:http://www.sigmaaldrich.com/catalog/product/sial/234729?lang=eng&region=US>; p. 2.

*Primary Examiner* — Richard Booth
(74) *Attorney, Agent, or Firm* — McAndrews, Held & Malloy, Ltd.

(57) ABSTRACT

The present technology generally relates to methods for metallizing an aluminum paste comprising contacting the aluminum paste with a cleaner, contacting the aluminum paste with an oxidation inhibiting deposit solution to deposit a layer of an oxidation inhibiting composition onto the aluminum paste and contacting the aluminum paste with conductive metal deposit solution to deposit a layer of a conductive metal onto the aluminum paste. Specifically, the present technology includes methods metallizing an aluminum paste comprising contacting the aluminum paste with an acidic cleaner, contacting the aluminum paste with an acid zincate solution to deposit zinc onto the aluminum paste and contacting the aluminum paste with an electroless nickel deposit solution to coat the aluminum paste with a nickel-phosphorus layer.

23 Claims, No Drawings

US 9,202,946 B2

METHODS FOR METALLIZING AN ALUMINUM PASTE

RELATED APPLICATION(S)

[Not Applicable]

FIELD OF THE INVENTION

The present technology generally relates to methods for metallizing an aluminum paste. Specifically, the present technology includes methods metallizing an aluminum paste comprising contacting the aluminum paste with an acidic cleaner, contacting the aluminum paste with an acid zincate solution to deposit zinc onto the aluminum paste and contacting the aluminum paste with an electroless nickel deposit solution to coat the aluminum paste with a nickel-phosphorus layer. This technology could be useful in the manufacture of printed circuitry, such as photovoltaic cells, printed circuit boards, ceramic materials, and three dimensional circuitry (e.g. cell phone antennas).

BACKGROUND OF THE INVENTION

The present application is related to metallic pastes. Metallic pastes have a number of uses, particularly in the field of printed circuitry. Metallic pastes can be printed (screen printed, inkjet printed, etc.) onto printed circuit boards, ceramic materials, three dimensional circuitry (e.g. cell phone antennas) and anywhere else where a conductive trace is needed. The most commonly used metallic paste is silver metallic paste. Palladium metallic paste is also common.

Both silver and palladium metallic pastes are expensive. One possible way of reducing the cost of using such pastes would be to use some other metallic paste and plating onto that metallic paste. One possible inexpensive metallic paste would be an aluminum paste. However, aluminum pastes cannot be directly plated with electrolytic processes because of the heavy, insulating oxide layers on the surface of aluminum particles. Furthermore, aluminum pastes are delicate and easily attacked, overly etched or destroyed during plating processes.

Electroless and electrolytic plating of conductive metals onto metallic pastes, such as silver pastes, are typically carried out using a non-etch soak clean step, an acid etch step, an alkaline zincate step and an electroless or electrolytic plating step. The metals are sufficiently conductive and can be directly electroplated or electrolessly plated after the zincate step using standard processes.

A metallic paste such as the aluminum paste discussed above is not designed or typically used for subsequent plating. Such a paste requires special processes to perform electroless or electrolytic plating onto it. This is because a metallic paste, such as aluminum, has heavy, insulating oxide layers on the surface of the aluminum particles. Furthermore, aluminum pastes are delicate and easily attacked, overly etched or destroyed during plating processes.

One possible application for a plated aluminum paste is in the manufacture of solar cells (also called a photovoltaic (PV) cell). A photovoltaic cell is an electrical device that converts the energy of light into electricity by the photovoltaic effect. It is a form of photoelectric cell (in that its electrical characteristics—e.g. current, voltage, or resistance—vary when light is incident upon it) which, when exposed to light, can generate and support an electric current without being attached to any external voltage source.

A typical silicon PV cell is composed of a thin wafer consisting of an ultra-thin layer of phosphorus-doped (N-type) silicon on top of a thicker layer of boron-doped (P-type) silicon. An electrical field is created near the top surface of the cell where these two materials are in contact, called the P-N junction. When sunlight strikes the surface of a PV cell, this electrical field provides momentum and direction to light-stimulated electrons, resulting in a flow of current when the solar cell is connected to an electrical load The process of fabricating conventional single—and polycrystalline silicon PV cells begins with very pure semiconductor-grade polysilicon—a material processed from quartz and used extensively throughout the electronics industry. The polysilicon is then heated to melting temperature, and trace amounts of boron are added to the melt to create a P-type semiconductor material. Next, an ingot, or block of silicon is formed, commonly using one of two methods: 1) by growing a pure crystalline silicon ingot from a seed crystal drawn from the molten polysilicon or 2) by casting the molten polysilicon in a block, creating a polycrystalline silicon material. Individual wafers are then sliced from the ingots using wire saws and then subjected to a surface etching process. After the wafers are cleaned, they are placed in a phosphorus diffusion furnace, creating a thin N-type semiconductor layer around the entire outer surface of the cell. Next, an anti-reflective coating is applied to the top surface of the cell.

An aluminized conductive material is deposited on the back (positive) surface of each cell, restoring the P-type properties of the back surface by displacing the diffused phosphorus layer. The aluminized conductive material is sometimes applied by screen-printing a metal paste, such as an aluminum paste.

Electrical contacts are also imprinted on the top (negative) surface of the cell. The grid-like metal contact made up of fine "fingers" and larger "bus bars" are typically screen-printed onto the top surface. This is typically done using a silver paste. As discussed above, silver pastes are very expensive. One step towards reducing the cost of PV cells is to print a finer silver grid and improve the conductivity of it by topcoating with various, less costly electroplated coatings such as nickel, copper, tin and various combinations of each. The plating of silver pastes is readily achieved by immersing the screen printed and fired wafers into a plating solution with the application of direct current or LIP plating. The metals are then deposited directly onto the silver paste without requiring any pretreatments due to the high conductivity and very thin oxide on the silver particles. As discussed above, a possible way of reducing the cost of PV cells would be to avoid the use of a silver paste by utilizing a plated aluminum paste.

SUMMARY OF THE INVENTION

The present technology generally relates to methods for metallizing an aluminum paste. Specifically, the present technology includes methods metallizing an aluminum paste comprising contacting the aluminum paste with an acidic cleaner, contacting the aluminum paste with an acid zincate solution to deposit zinc onto the aluminum paste and contacting the aluminum paste with an electroless nickel deposit solution to coat the aluminum paste with a nickel-phosphorus layer. This technology could be useful in the manufacture of printed circuitry, such as photovoltaic cells, printed circuit boards, ceramic materials, and three dimensional circuitry (e.g. cell phone antennas).

An embodiment of the current method of metallizing an aluminum paste comprises contacting an aluminum paste with an oxidation inhibiting deposit solution to deposit a layer of an oxidation inhibiting composition onto the aluminum paste; and contacting the aluminum paste with conductive metal deposit solution to deposit a layer of a conductive metal onto the aluminum paste. The method can also involve contacting the aluminum paste with a cleaner prior to contacting with the oxidation inhibiting deposit solution.

The substrate can be a photovoltaic cell, a printed circuit board, a ceramic material or a three dimensional circuitry.

The cleaner cleans the surface of the aluminum paste and etches off at least a portion of any heavy oxide layer present on the surface of the aluminum particles. The cleaner does not overattack the aluminum paste. The cleaner does not cause adhesion failure. The cleaner can be an acidic cleaner. For example, the acid cleaner can be made up of sulfuric acid, borax, tetrapotassium pyrophosphate, sodium xylenesulfonate and polyethylene glycol tert-octylphenyl ether.

The oxidation inhibiting composition prevents the aluminum paste from oxidizing. The oxidation inhibiting composition minimizes attack on the aluminum paste during further processing steps. The oxidation inhibiting composition is active towards subsequent processing steps. The oxidation inhibiting compound can be zinc, tin, palladium, silver, copper or gold. The oxidation inhibiting deposit solution can be an acid zincate solution, an alkaline zincate solution, an acid palladium solution, an alkaline palladium solution, an immersion tin solution, an immersion silver solution, an immersion copper solution or an immersion gold solution.

In one example the oxidation inhibiting deposit solution is an acid zincate solution and said oxidation inhibiting composition is zinc. In this example the acid zincate solution can comprise fluoboric acid, zinc oxide, boric acid, borax and sodium hydroxide.

The conductive metal deposit solution can be an electroless metal deposit solution or an electrolytic metal deposit solution.

The conductive metal can be selected from nickel and its alloys, copper and its alloys, tin and its alloys, silver and its alloys, gold and its alloys, palladium and its alloys, zinc and its alloys and cobalt and its alloys.

In one example, the conductive metal deposit solution is an electroless nickel deposit solution. In that example the electroless nickel deposit solution can comprise malic acid, lactic acid, citric acid, succinic acid, glycine, sodium hypophosphite, caustic soda beads and nickel sulfate crystals.

The layer of conductive metal renders the aluminum paste conductive enough to perform subsequent electroplating processes. The layer of conductive metal protects the aluminum paste from being attacked during subsequent plating processes.

An embodiment of the current method of metallizing an aluminum paste comprises contacting the aluminum paste with an acidic cleaner to clean the surface of the aluminum paste and etch off at least a portion of any heavy oxide layer present on the surface of the aluminum paste; contacting the aluminum paste with an acid zincate solution to deposit zinc onto the aluminum paste; and contacting the aluminum paste with an electroless nickel deposit solution to coat the aluminum paste with a nickel-phosphorus layer.

The substrate can be a photovoltaic cell, a printed circuit board, a ceramic material or a three dimensional circuitry.

The cleaner does not overattack the aluminum paste. The cleaner does not cause adhesion failure. The cleaner can be an acidic cleaner. For example, the acid cleaner can be made up of sulfuric acid, borax, tetrapotassium pyrophosphate, sodium xylenesulfonate and polyethylene glycol tert-octylphenyl ether.

The acid zincate solution can comprise fluoboric acid, zinc oxide, boric acid, borax and sodium hydroxide.

The electroless nickel deposit solution can comprise malic acid, lactic acid, citric acid, succinic acid, glycine, sodium hypophosphite, caustic soda beads and nickel sulfate crystals.

The nickel-phosphorus layer renders the aluminum paste conductive enough to perform subsequent electroplating processes. The nickel-phosphorus layer protects the aluminum paste from being attacked during subsequent plating processes.

DETAILED DESCRIPTION OF THE PREFERRED EMBODIMENT(S)

The present technology generally relates to methods for metallizing an aluminum paste. Specifically, the present technology includes methods of using (1) an acidic cleaner, (2) an acid zincate solution and (3) an electroless nickel bath to apply an electroless nickel coating to an aluminum paste. The electroless nickel coating renders the surface of the aluminum paste conductive and allows it to be coated with subsequent electrolytic deposits, as needed. This technology could be useful in the manufacture of printed circuitry, such as photovoltaic cells, printed circuit boards, ceramic materials, and three dimensional circuitry (e.g. cell phone antennas). The embodiments disclosed herein are intended to be illustrative and it will be understood that the invention is not limited to these embodiments since modification can be made by those of skill in the art without departing from the scope of the present disclosure.

The current method of metallizing an aluminum paste on a substrate comprises optionally contacting the aluminum paste with a cleaner to clean the surface of the aluminum paste and etch off at least a portion of any heavy oxide layer present on the surface of the aluminum particles, contacting an aluminum paste with an oxidation inhibiting deposit solution to deposit a layer of an oxidation inhibiting composition onto the aluminum paste and contacting the aluminum paste with a conductive metal deposit solution to deposit a layer of a conductive metal onto the aluminum paste.

The current method is useful for a number of applications where it is desired to deposit a conductive metal onto an aluminum paste. This technology could be useful in the manufacture printed circuitry, such as photovoltaic cells, printed circuit boards, ceramic materials, and three dimensional circuitry (e.g. cell phone antennas). This technology can be used to replace silver pastes, sputtered metal layers or other expensive metallization techniques. In a preferred embodiment the current method is used for plating conductive metals onto photovoltaic cells. Specifically, aluminum pastes can be applied to a photovoltaic cell in place of expensive silver pastes. Using the methods disclosed herein conductive metals can then be deposited onto the aluminum paste.

The present method can include contacting an aluminum paste with a cleaner. The cleaner acts to clean the surface of the aluminum particles. For example it removes light soils, fingerprints, oils and other common surface contamination. The cleaner acts to mildly etch off any heavy oxide layer present on the surface of the aluminum particles in the aluminum paste. The cleaner should clean and etch the aluminum particles without overattacking the aluminum particles and/or causing adhesion failure. The cleaner should rinse well and provide a bright, clean, film-free surface.

The cleaner can be a cleaner known in the art that will clean the aluminum paste and mildly etch off any heavy oxide layer present on the surface of the aluminum particles while not overattacking the aluminum paste. A preferred cleaner is an acidic cleaner. One embodiment of the current acidic cleaner comprises an acid, at least one surfactant and optionally at least one buffer. Examples of possible acids include sulfuric acid, phosphoric acid, malic acid, citric acid, lactic acid and hydrochloric acid. The acid can be added in the following amounts 1-300 g/L or preferably 5-80 g/L. Examples of possible surfactants include sodium xylenesulfonate and polyethylene glycol tert-octylphenyl ether. The surfactant can be added in the following amounts 1-200 g/L or preferably 5-100 g/L. Examples of possible buffers include borax and tetrapotassium pyrophosphate. The buffer can be added in the following amounts 1-100 g/L or preferably 2-10 g/L. One embodiment of the current acidic cleaner comprises sulfuric acid, borax, tetrapotassium pyrophosphate, sodium xylenesulfonate and polyethylene glycol tert-octylphenyl ether.

In other embodiments optional components that will not compromise the cleaning step can also be added. An example of such an optional component is a chelator.

The current cleaning step may take place at a temperature suitable to obtain the desired metallization. For example, the desired result may be achieved at ambient temperature to 90° C., preferably 30-70° C. or preferably at 66° C.

The current cleaning step may take place for a duration of time suitable to obtain the desired metallization. For example, the desired result may be achieved in 15 seconds to 10 minutes, 3-7 minutes, or preferably 1 minute.

The current cleaning step may take place at a pH suitable to obtain the desired metallization. For example, the desired result may be preferably achieved at a pH below 3.

The present method includes contacting an aluminum paste with an oxidation inhibiting deposit solution to deposit a layer of an oxidation inhibiting composition onto the aluminum particles. The oxidation inhibiting composition acts to prevent the aluminum particles from oxidizing. This helps to minimizes attack on the aluminum particles during further processing steps. The oxidation inhibiting composition promotes adhesion and pore free deposits of the conductive metal. This step helps to minimize reoxidation of the aluminum surface ensuring good adhesion of subsequent deposits.

Oxidation inhibiting composition should be active towards subsequent processing steps and provide a platable surface that does not interfere with subsequent adhesion of a conductive metal. The oxidation inhibiting compound can be selected from zinc, tin, palladium, silver, copper, gold and alloys of those metals.

The oxidation inhibiting composition is applied via an oxidation inhibiting deposit solution. The oxidation inhibiting deposit solution can be a solution that deposits a complete, even layer of an oxidation inhibiting compound onto the aluminum particles without damaging the aluminum particles. For example, the oxidation inhibiting solution can be selected from an acid zincate solution, an alkaline zincate solution, an acid palladium solution, an alkaline palladium solution, an immersion tin solution, an immersion silver solution, an immersion copper solution and an immersion gold solution.

In a preferred embodiment the oxidation inhibiting deposit solution is an acid zincate solution and said oxidation inhibiting composition is zinc and/or its alloys. One embodiment of the present acid zincate solution comprises an acid, a zinc salt, at least one buffer and a pH adjustor. For example, possible acids include fluoboric acid, phosphoric acid, hydrofluoric acid and organic acids. The acid can be added in the following amounts 1-500 g/L or preferably 100-200 g/L. For example, possible zinc salts include zinc oxide, zinc sulfate, zinc fluoborate, zinc metal and zinc chloride. The zinc salt can be added in the following amounts 1-200 g/L or preferably 20-50 g/L. For example possible buffers include boric acid, borax, acetic acid and sodium acetate. The buffers can be added in the following amounts 1-50 g/L or preferably 5-10 g/L. For example, possible pH adjusters include sodium hydroxide, ammonium hydroxide, potassium hydroxide, sodium carbonate and potassium carbonate. The pH adjuster can be added in the following amounts 1-100 g/L or preferably 1-2 g/L. The pH adjuster can also be added in amounts sufficient to keep the pH within a range of 1-7 or preferably 2-3. One embodiment of current acid zincate solution comprises fluoboric acid, zinc oxide, boric acid, borax and sodium hydroxide. The acid zincate solution can be cyanide-free.

In other embodiments optional components that will not compromise oxidation inhibiting deposition step can also be added. One example of such an optional component is grain refiners such as nickel salts and copper salts.

The current oxidation inhibiting deposition step may take place at a temperature suitable to obtain the desired metallization. For example, the desired result may be achieved at 15-50° C., preferably 20-25° C., or preferably 22° C.

The current oxidation inhibiting deposition step may take place for a duration of time suitable to obtain the desired metallization. For example, the desired result may be achieved in 5-120 seconds, preferably 30-90 seconds, or preferably 45-60 seconds.

The current oxidation inhibiting deposition step may take place at a pH suitable to obtain the desired metallization. For example, the desired result may be achieved at 1-7, preferably 2-3, or preferably 2.5.

The present method includes contacting the aluminum paste with a conductive metal deposit solution to deposit a layer of a conductive metal onto the aluminum particles. The conductive metal renders the aluminum particles conductive enough to perform subsequent electroplating processes. The conductive metal also protects the aluminum particles from being attacked during subsequent plating processes.

The conductive metal can be an electroless metal or an electrolytic metal. The conductive metal can be selected from nickel, copper, tin, silver, gold, palladium, zinc, cobalt and alloys of those metals. The conductive metal deposit solution can be an electroless metal deposit solution or an electrolytic metal deposit solution.

In a preferred embodiment the conductive metal deposit solution is an electroless nickel deposit solution. The electroless nickel deposit solution can be used to plate a nickel phosphorous deposit onto the aluminum particles. The nickel deposit solution is selective to the aluminum paste and will not deposit on the other non-desired areas such as FR-4, silicon dioxide or silicon nitride (ARC). The nickel deposit solution exhibits good stability.

In one preferred embodiment the electroless nickel deposit solution comprises an acidic electroless nickel deposit solution. One embodiment of the current acidic electroless nickel bath comprises malic acid, lactic acid, citric acid, succinic acid, glycine, sodium hypophosphite, caustic soda beads and nickel sulfate crystals.

The current conductive metal deposition step may take place at a temperature suitable to obtain the desired metallization. For example, the desired result may be achieved in an alkaline electroless nickel bath at 25-65° C. or preferably 30-60° C. and the desired result may be achieved in an acidic electroless nickel bath at 79-95° C. preferably 80-85° C.

The current conductive metal deposition step may take place for a duration of time suitable to obtain the desired levels of corrosion protection and conductivity. For example, the desired result may be achieved in 5-20 minutes.

Additional optional steps may also be added. For example steps could include rinsing, desmutting, neutralizing, drying and subsequent electroplating.

A person familiar with the technology will understand that the conditions described above can be varied and adjusted to achieve the desired metallization.

EXAMPLE 1

In one non-limiting embodiment, a photovoltaic silicon wafer with an aluminum paste thereon was contacted with a cleaner. The cleaner was made up of 76 g/L sulfuric acid, 3 g/L borax, 0.6 g/L tetrapotassium pyrophosphate, 70 g/L sodium xylenesulfonate and 7.3 g/L polyethylene glycol tert-octylphenyl ether. The cleaner was applied by soaking the silicon wafer in a bath with the cleaner at a temperature of 66° C. for 5 minutes. The cleaned silicon wafer with aluminum paste thereon was then rinsed twice with water. The resulting cleaned aluminum paste was bright, cleaned of any fingerprints, oils and other common surface contaminants and film-free. The heavy oxide layer present on the aluminum particles was etched off. The resulting cleaned aluminum paste had a mild uniform etch. The resulting aluminum paste exhibited minimal attack on the aluminum particles.

The cleaned silicon wafer with aluminum paste thereon was then contacted with an acid zincate solution. The acid zincate solution comprised 145 g/L fluoboric acid, 34 g/L zinc oxide, 3.7 g/L boric acid, 3.7 g/L borax and 1.5 g/L sodium hydroxide. The acid zincate solution was applied by immersing the silicon wafer in a bath with the acid zincate solution at a pH of 2.75, at a temperature of 22° C., for 60 seconds. The acid zincate solution deposited a layer of zinc onto the aluminum particles. The silicon wafer with zinc coated aluminum paste thereon was then rinsed twice with distilled deionized water. The resulting zinc coated aluminum paste exhibited minimal attack on the aluminum particles. The resulting zinc coated aluminum paste showed even, full coverage of the aluminum by the zinc.

The silicon wafer with zinc coated aluminum paste thereon was then contacted with an acidic electroless nickel bath. The acidic electroless nickel bath comprised 21 g/L malic acid, 12 g/L lactic acid, 3 g/L citric acid, 3 g/L succinic acid, 12 g/L glycine, 30 g/L sodium hypophosphite, 26.8 g/L nickel sulfate crystals, 19.8 g/L sodium hydroxide and 0.3 mg/L lead. The acidic electroless nickel bath was operated at the following conditions: nickel metal at 6.0 g/L, temperature at 82° C., sodium hypophosphite at 30 g/L, workload at 1 dm$^2$/L, pH at 5.1, plating rate at 0.1 micro-inches/minute and continuous mechanical and solution movement at the rate of 5-8 solution turnovers per hour. The acidic electroless nickel bath deposited a layer of nickel/phosphorous on the aluminum particles. The silicon wafer with nickel/phosphorous coated aluminum paste thereon was then rinsed twice with distilled deionized water. The resulting nickel/phosphorous coated aluminum paste exhibited minimal attack on the aluminum particles. The resulting nickel phosphorous coating rendered the surface of the aluminum paste conductive. The resulting nickel/phosphorous aluminum paste showed excellent adhesion and pore-free deposits. The resulting nickel/phosphorous aluminum paste showed even, full coverage of the aluminum by the nickel.

The electroless nickel deposit was then electroplated with the desired metals, such as copper, tin, silver, gold, palladium, or combinations thereof. The electroplating resulted in a metal plating on the aluminum paste. The silicon wafer with metal plated aluminum paste thereon was then rinsed twice with distilled deionized water. The silicon wafer with metal plated aluminum paste was then dried. The resulting silicon wafer with metal plated aluminum paste showed excellent adhesion and pore free deposits. The resulting silicon wafer with metal plated aluminum paste resulted in a complete coverage of the nickel and aluminum by the conductive metal. This was seen visually as well as with a scanning electron microscope. This was also seen with cross sections visually and with a scanning electron microscope. The aluminum paste also exhibited increased conductivity indicating good plating.

While particular elements, embodiments and applications have been shown and described, it will be understood, of course, that the invention is not limited thereto since modification can be made by those of skill in the art without departing from the scope of the present disclosure, particularly in light of the foregoing teachings.

What is claimed is:

1. A method of metallizing an aluminum paste on a substrate, comprising:
    contacting the aluminum paste with a mildly acidic cleaner;
    contacting an aluminum paste with an oxidation inhibiting acid zincate deposit solution to deposit an oxidation inhibiting layer of zinc onto the aluminum paste; and
    contacting the aluminum paste with conductive metal deposit solution to deposit a layer of a conductive metal onto the aluminum paste.

2. The method of claim 1 wherein said substrate is a photovoltaic cell, a printed circuit board, a ceramic material or a three dimensional circuitry.

3. The method of claim 2 wherein said substrate is a photovoltaic cell.

4. The method of claim 1 wherein said mildly acidic cleaner cleans the surface of the aluminum paste and etches off at least a portion of any heavy oxide layer present on the surface of the aluminum particles.

5. The method of claim 1 wherein said mildly acidic cleaner does not overattack the aluminum paste.

6. The method of claim 1 wherein said mildly acidic cleaner does not cause adhesion failure.

7. The method of claim 1 wherein said mildly acidic cleaner comprises sulfuric acid, borax, tetrapotassium pyrophosphate, sodium xylenesulfonate and polyethylene glycol tert-octylphenyl ether.

8. The method of claim 1 wherein said oxidation inhibiting layer of zinc prevents the aluminum paste from oxidizing.

9. The method of claim 1 wherein the oxidation inhibiting layer of zinc attack on the aluminum paste during further processing steps.

10. The method of claim 1 wherein the oxidation inhibiting layer of zinc active towards subsequent processing steps.

11. The method of claim 1 wherein said acid zincate solution comprises fluoboric acid, zinc oxide, boric acid, borax and sodium hydroxide.

12. The method of claim 1 wherein said conductive metal deposit solution is an electroless metal deposit solution.

13. The method of claim 1 wherein said conductive metal deposit solution is an electrolytic metal deposit solution.

14. The method of claim 1 wherein said conductive metal is selected from nickel and its alloys, copper and its alloys, tin and its alloys, silver and its alloys, gold and its alloys, palladium and its alloys, zinc and its alloys and cobalt and its alloys.

15. The method of claim 1 wherein said conductive metal deposit solution is an electroless nickel deposit solution.

16. The method of claim 15 wherein said acidic electroless nickel deposit solution comprises malic acid, lactic acid, citric acid, succinic acid, glycine, sodium hypophosphite, caustic soda beads and nickel sulfate crystals.

17. The method of claim 1 wherein said layer of conductive metal renders the aluminum paste conductive enough to perform subsequent electroplating processes.

18. The method of claim 1 wherein said layer of conductive metal protects the aluminum paste from being attacked during subsequent plating processes.

19. A method of metallizing an aluminum paste on a substrate, comprising:
   contacting the aluminum paste with an acidic cleaner to clean the surface of the aluminum paste and etch off at least a portion of any heavy oxide layer present on the surface of the aluminum paste;
   contacting the aluminum paste with an acid zincate solution to deposit zinc onto the aluminum paste; and
   contacting the aluminum paste with an electroless nickel deposit solution to coat the aluminum paste with a nickel-phosphorus layer
wherein said method does not over attack the aluminum paste or cause adhesion failure.

20. The method of claim 19 wherein said acidic cleaner comprises sulfuric acid, borax, tetrapotassium pyrophosphate, sodium xylenesulfonate and polyethylene glycol tert-octylphenyl ether.

21. The method of claim 19 wherein said acid zincate solution comprises fluoboric acid, zinc oxide, boric acid, borax and sodium hydroxide.

22. The method of claim 19 wherein said acidic electroless nickel deposit solution comprises malic acid, lactic acid, citric acid, succinic acid, glycine, sodium hypophosphite, caustic soda beads and nickel sulfate crystals.

23. The method of claim 19 wherein said substrate is a photovoltaic cell, printed circuit board, ceramic substrate or three dimensional circuitry.

* * * * *